United States Patent
Hori et al.

(10) Patent No.: US 6,261,862 B1
(45) Date of Patent: Jul. 17, 2001

(54) PROCESS FOR PRODUCING PHOTOVOLTAIC ELEMENT

(75) Inventors: Tadashi Hori, Nara; Masahiro Kanai, Kyoto; Hirokazu Ohtoshi; Naoto Okada, both of Nara; Koichiro Moriyama, Kyotanabe; Hiroshi Shimoda, Kyotanabe; Hiroyuki Ozaki, Kyotanabe, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/358,930

(22) Filed: Jul. 23, 1999

(30) Foreign Application Priority Data

Jul. 24, 1998 (JP) .................................... 10-208813

(51) Int. Cl.⁷ .................................................. H01L 21/00
(52) U.S. Cl. .................................. 438/96; 438/61; 438/62
(58) Field of Search ................................ 438/61, 62, 69, 438/96, 97

(56) References Cited

U.S. PATENT DOCUMENTS 5,897,332 * 4/1999 Horis et al. ............................ 438/61
6,025,039 * 2/2000 Yajima .................................. 438/96

FOREIGN PATENT DOCUMENTS 9-191120   7/1997 (JP) .............................. H01L/31/04

* cited by examiner

Primary Examiner—David Nelms
Assistant Examiner—Dung Ang Le
(74) Attorney, Agent, or Firm—Fitzpatrick, Cella, Harper & Scinto

(57) ABSTRACT

A process is provided for producing a photovoltaic element which has at least one pin junction, and a buffering semiconductor layer constituted of plural sublayers between an n-type layer and an i-type layer and/or between an i-type layer and a p-type layer, through production steps of introducing a source material gas into an electric discharge space in a reaction chamber, and decomposing the source material gas by plasma discharge to form a non-monocrystalline semiconductor layer. In the process, in electric discharge generation for formation of at least one of the sublayers, the polarity of the electrode confronting the substrate for formation of a first sublayer and the polarity of the electrode confronting the substrate for formation of a second sublayer adjacent to the first sublayer is made different from each other, or the potential of one of the electrodes is set at zero volt. Thereby, diffusion of the dopant from the p-type layer or the n-type layer into the i-type layer is prevented effectively. The produced photovoltaic element is improved in the output properties, the open-circuit voltage, and the fill factor, and these properties deteriorate less.

7 Claims, 5 Drawing Sheets

PROCESS FOR PRODUCING PHOTOVOLTAIC ELEMENT

BACKGROUND OF THE INVENTION

1. Field of the Invention

The present invention relates to a process for producing a photovoltaic element like solar cells and optical sensors, particularly to a process for producing a photovoltaic cell where a buffering semiconductor layer is formed at the interface in the semiconductor junction.

2. Related Background Art

Solar cells utilizing the photovoltaic effect of a semiconductor as a photovoltaic element are being actively studied and developed for commercialization, since the solar cells utilize natural energy of sunlight. There are many types of solar cells in classification by the semiconductor material. For example, a solar cell employing a non-monocrystalline semiconductor film is produced generally by a plasma CVD (chemical vapor deposition) process.

The semiconductor layers of the solar cell have a semiconductor junction such as a pn junction, and a pin junction. In the case where thin films of a-Si or the like is employed as the semiconductor layer, a desired semiconductor junction can readily be formed by laminating, on a substrate successively, semiconductor films produced by mixing a source gas such as silane ($SiH_4$), and a dopant element such as phosphine ($PH_3$) and diborane ($B_2H_6$), and decomposing the mixture by plasma activation to form a semiconductor film of a desired conductivity type. In producing a solar cell of a non-monocrystalline type, the respective semiconductor layers are formed in separate film formation chambers.

U.S. Pat. No. 4,400,409, for example, discloses a continuous plasma CVD apparatus employing a roll-to-roll system. This apparatus has plural glow discharge region, namely chambers for formation of semiconductor layers, in series, and a flexible very long substrate sheet having a prescribed breadth is allowed to pass through the chambers successively. With the passage of the substrate, a prescribed conduction type of semiconductor layer is deposited in the glow discharge region of the respective chambers onto the substrate. By continuous delivery of the substrate in the length direction, elements having semiconductor junctions are produced continuously. In this apparatus, gas gates are provided to prevent the diffusion of the dopant gas for the film formation reaction into the adjacent glow discharge region. Specifically, the respective glow discharge regions are separated by a narrow slit-shaped opening as a separation path, and the separation path is swept by a gas such as Ar, and $H_2$.

However, such conventional processes for producing photovoltaic elements (solar cells) have disadvantages below.

(1) A first disadvantage is the low initial photoelectric conversion efficiency. For example, during or after formation of an i-type layer on an n-type layer, phosphorus (P), an n-type layer dopant, diffuses thermally into the i-type layer to weaken the ni junction to drop the open-circuit voltage or fill factor, although the contamination of the gaseous dopant is prevented by separation of the i-type layer formation space from the p- or n-type layer formation space by the gas gate.

(2) Another disadvantage is the low reliability owing to deterioration of the solar cells caused by gradual thermal diffusion of a dopant for a p-type layer or an n-type layer into the i-type layer during practical use under a varieties of conditions of weather and installation.

The solar cell is required to have sufficiently high photoelectric conversion efficiency and stable properties, and to be producible readily industrially. Therefore, solar cells are desirably produced industrially with reproducibility at a high film formation rate with a large cell area with improvement of electrical, optical, photoconductive, and mechanical properties, fatigue strength, and environmental resistance.

Power generation systems employing solar cells are usually provided by connecting standardized unit modules of a solar cell element in series or in parallel into a unit to obtain a desired voltage and electric current.

In the unit construction, the overall properties of the unit are depend on the unit module of the lowest current-voltage properties. Therefore, it is important not only to improve properties of the respective unit modules but also to reduce variation of the properties among the unit modules. Moreover, not to lower the production yield, wire disconnection and short-circuit should be prevented. For this purpose, the semiconductor layers, which are the main portion of the solar cell, should be made uniform in properties in production of the unit modules to decrease defects of the semiconductor layers. Therefore, in consideration of facility of the module design and simplification of the module assembling process, it is necessary to provide a semiconductor deposition film having uniform properties over a large area in order to raise the productivity and reduce remarkably the production cost of the solar cells.

SUMMARY OF THE INVENTION

To solve the above problems of the prior arts, the present invention intends to provide a process for producing a photovoltaic element, not causing diffusion of a p-type layer dopant or an n-type layer dopant into another layer such as an i-type layer, having improved output properties, especially the open-circuit voltage and the fill factor of the element, and giving less deterioration of the properties.

The process for producing a photovoltaic element of the present invention produces a photovoltaic element having at least one pin junction, and a buffering semiconductor layer constituted of plural sublayers between an n-type layer and an i-type layer and/or between an i-type layer and a p-type layer through production steps of introducing a source material gas into an electric discharge space in a reaction chamber, and decomposing the source material gas by plasma discharge to form a non-monocrystalline semiconductor layer, wherein, in electric discharge generation for formation of at least one of the sublayers, the polarity of the electrode confronting the substrate for formation of a first sublayer and the polarity of the electrode confronting the substrate for formation of a second sublayer adjacent to the first sublayer is made different from each other, or the potential of one of the electrodes is set at zero volt.

In this specification, the aforementioned sublayers are referred to as a first buffering semiconductor layer, a second buffering semiconductor layer, and so forth; the buffering semiconductor layer between the n-type layer and the i-type layer is referred to as an n/i buffering layer, and the buffering semiconductor layer between the i-type layer and the p-type layer is referred to as a p/i buffering layer. For example, in a buffering semiconductor layer having plural sublayers between an n-type layer and an i-type layer, the sublayers are called a first n/i buffering semiconductor layer, and a second n/i buffering semiconductor layer.

The electrode confronting the substrate is generally called a cathode electrode. When the polarity is made positive (+), it becomes an anode electrode. The counter electrode opposing to the above electrode may be the substrate on which the film is formed or may be provided separately.

In a preferred embodiment of the process for producing a photovoltaic cell of the present invention, at least one portion of the buffering layer is constituted of a-Si:H, a-SiGe:H, or a-SiC:H.

In another preferred embodiment of the process for producing a photovoltaic cell of the present invention, the photovoltaic cells constitute a solar cell.

In still another preferred embodiment of the process for producing a photovoltaic cell of the present invention, the substrate is moved through film formation spaces each having an electric discharge means.

In a further preferred embodiment of the process for producing a photovoltaic cell of the present invention, the substrate is in a shape of a belt.

DESCRIPTION OF THE PREFERRED EMBODIMENTS

In the production of a photovoltaic element, in electric discharge for formation of a buffering semiconductor layer, the polarity of the electrode confronting the substrate for formation of sublayers is changed from that of the adjacent sublayer, or either one of the above electrodes is set at zero volt, whereby the buffering semiconductor layer is formed to be adaptable to the band gaps of the p-type layer or the n-type layer, and the buffering semiconductor layer can be formed at a pi interface and/or an ni interface in which thermal diffusion of a dopant for a p-type layer or an n-type layer into an i-type layer is prevented effectively. Thereby, a solar cell can be provided which has improved output characteristics, such as the open-circuit voltage, and the fill factor.

The effective buffering semiconductor layer provided at a pi interface and/or an ni interface prevents diffusion of an dopant in practical use conditions, which reduces deterioration of a solar cell, enabling production of a solar cell having improved reliability.

In particular, in a lamination type photovoltaic element, an excellent pn junction can be realized to give a photovoltaic element of higher quality with high reproducibility and high uniformity.

A photovoltaic element having stable characteristics can be mass-produced by forming at least a portion of the buffering semiconductor layer from a-Si:H, a-SiGe:H, or a-SiC:H.

A solar cell produced by use of the above photovoltaic elements has semiconductor junctions in which the diffusion of the dopant is prevented.

In production of the photovoltaic cell, the semiconductor layers are continuously formed and laminated by delivering a substrate through plural film formation spaces having respectively an electric discharge means arranged successively, thereby the film thickness and the film quality are uniformized.

In production of the photovoltaic element, belt-shaped substrate may be delivered continuously through a film formation spaces to form a semiconductor film continuously on the substrate, which is suitable for mass-production of the photovoltaic element.

Figure 1:
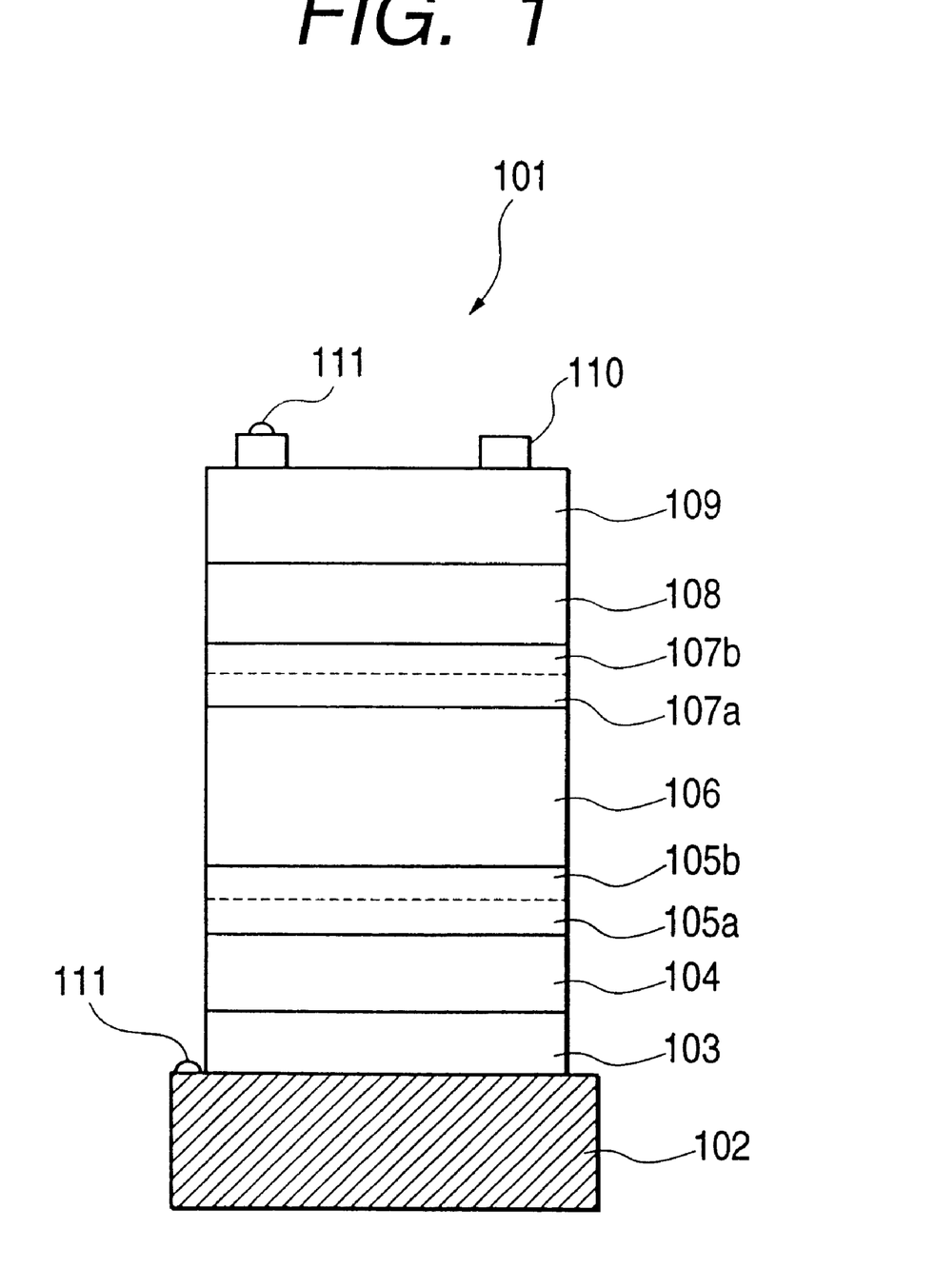
FIG. 1 is a schematic sectional view of a solar cell constituted of a photovoltaic cell produced according to the present invention.

The preferred embodiments of the process for producing a photovoltaic element of the present invention is explained by reference to annexed drawings. FIG. 1 is a schematic sectional view of a solar cell constituted of a photovoltaic cell produced according to the present invention.

This solar cell 101 is of an amorphous type, constituted of substrate 102, and thereon back reflection layer 103, n-type semiconductor layer 104, first n/i buffering semiconductor layer 105a, second n/i buffering semiconductor layer 105b, i-type semiconductor layer 106, first p/i buffering semiconductor layer 107a, second buffering semiconductor layer 107b, p-type semiconductor layer 108, transparent electrode 109, laminated in the named order. On the transparent electrode 109, are provided collector electrode 110 and output electrode 111. Another output electrode 111 is provided also on substrate 102. Light is projected from the side of transparent electrode 109.

(Substrate)

Substrate 102 is preferably composed of an electroconductive material which is deformed or distorted less at the film formation temperature of the semiconductor layers and has high strength. The substrate material includes thin plates of metals such as stainless steel, aluminum and alloys thereof, iron and alloys thereof, copper and alloys thereof, and composite thereof; and above materials coated on the surface with a thin film of a different metal, or a thin insulative film of $SiO_2$, $Si_3N_2$, $Al_2O_3$, $AlN_3$, or the like formed by surface treatment of sputtering, vapor deposition, or plating. Substrate 102 may also be constituted of a sheet of a heat-resistant resin such as polyimide resins, polyamide resins, polyethylene terephthalate resins, and epoxy resins, or a composite thereof with glass fiber, carbon fiber, boron fiber, or metal fiber, which is surface-treated for electroconductivity with a metal or a metal alloy, or a transparent electroconductive oxide (TCO) by metal plating, vapor deposition, sputtering, or coating application.

The thickness of substrate 102 is preferably as thin as possible for saving of the cost and the space, provided that the substrate has sufficient strength to keep its shape in the delivery in the element production apparatus. The thickness ranges, for example, from 0.01 to 5 mm, preferably from 0.02 to 2 mm, more preferably 0.05 to 1 mm. Incidentally, a metal plate as substrate 102 can be relatively thin to obtain a desired strength.

The breadth of substrate 102 is not specially limited, and may be decided to correspond to the size of the production apparatus for semiconductor layer formation (chamber for semiconductor layer formation). The length of substrate 102 is also not limited specially, and may be such that the substrate can be wound in a roll shape, or long substrates are joined by welding or a like method for larger length. The surface of substrate 102 may be smooth, or may have fine roughness. When the surface is made to be finely rough, the protrusions may be spherical, conical, or pyramidal, and the maximum height (Rmax) ranges, for example, from 50 to 500 nm for irregular reflection at the surface to increase the optical path of the reflected light.

(Back Reflection Layer)

Transparent electrode 109 on the light introduction side and back reflection layer 103 on the bottom side are provided in opposition with interposition of semiconductor layers.

Back reflection layer 103 is formed from a metal such as Ag, Au, Pt, Ni, Cr, Al, Ti, Zn, Mo, and W, or an alloy thereof by vacuum vapor deposition, electron beam vapor deposition, sputtering, or the like. The metal thin film functions as a resistance component against the output of solar cell 101, so that the sheet resistance is set preferably to be not higher than 50 Ω, more preferably not higher than 10 Ω.

(Transparent Electrode)

Transparent electrode 109 is preferably constituted of a thin metal film formed from a metal oxide such as $SnO_2$, $In_2O_3$, ZnO, CdO, $Cd_2SnO_4$, and ITO (indium tin oxide: $In_2O_3+SnO_2$), or a metal such as Au, Al, and Cu in an extremely thin semi-transparent state having light transmittance of preferably not lower than 70%, more preferably not lower than 80% for efficient absorption of light from the sun, a white fluorescence lamp, or the like into the semiconductor layers.

Transparent electrode 109, which is laminated in this embodiment on p-type semiconductor layer 108, may be laminated on an n-type semiconductor layer when the lamination construction is different. Transparent electrode 109 is formed in a suitable method such as resistance-heat vapor deposition, sputtering, and spraying.

(Collector Electrode)

Collector electrode 110 is formed on transparent electrode 109 from a metal such as Ag, Cr, Ni, Al, Au, Ti, Pt, Cu, Mo, and W, or an alloy thereof, or carbon or the like to lower the sheet resistance of transparent electrode 109. In the lamination structure shown in FIG. 1, since transparent electrode 109 is formed after formation of the semiconductor layers, the substrate temperature cannot be raised sufficiently high, resulting in relatively high sheet resistance of transparent electrode 109. For lower resistance, formation of collector electrode 110 is particularly preferred. The material for collector electrode 110 is suitably selected in consideration of the advantages of the aforementioned metals and carbon of low resistance, less diffusion, durability, and ease of electrode formation by printing or the like process.

For sufficient introduction of light into the underlying semiconductor layers, collector electrode 110 has preferably a shape distributing uniformly over the light-receiving layer, the area being preferably not more than 15%, more preferably not more than 10%, and the sheet resistance being preferably not more than 50 Ω, more preferably not more than 10 Ω.

(Transparent Electroconductive Layer)

A transparent electroconductive layer (buffering resistance layer) may be formed from ZnO or the like between back reflection layer 103 and n-type semiconductor layer 104 for prevention of short circuiting and electrode-metal buffering. Specifically, this transparent electroconductive layer prevents diffusion of a metal element constituting the back reflection layer 103 into n-type semiconductor layer 104, and a suitable resistance given to the transparent electroconductive layer stops the short-circuiting, resulting from a pinhole or other defect, between back reflection layer 103 and top transparent electrode 109 provided with interposition of the semiconductor layers. Further, this transparent electroconductive layer is capable of enclosing the introduced light causing multiple interference within solar cell 101. This transparent electroconductive layer may be formed from a material including a magnesium fluoride-based material; and oxides, nitrides, and carbides of indium, tin, cadmium, zinc, antimony, silicon, chromium, silver, copper, and aluminum, and mixtures thereof. Of these materials, magnesium fluoride, and zinc oxide are preferred for the transparent electrode layer because of ease of the layer formation, and suitable resistance and light-transmissivity.

(Semiconductor layers)

i-Type semiconductor layer 106 may be formed from a semiconductor material of a IV-Group type element or a IV-Group alloy, including a-Si:H, a-Si:F, a-Si:H:F, a-SiC:H, a-SiC:F, a-SiC:H:F, a-SiGe:H, a-SiGe:F, a-SiGe:H:F, μc-SiH, μc-SiGe:H, μc-SiC:H, polycrystalline Si:H, polycrystalline Si:F, and polycrystalline Si:H:F (herein "a-" means "amorphous", and "μc-" means "microcrystalline"). The content of the hydrogen atoms in this i-type semiconductor layer 106 is preferably not higher than 20 atom %, more preferably not higher than 10 atom %.

n-Type semiconductor layer 104, and p-type semiconductor layer 108 may be formed by doping a valence electron-controlling agent into the same semiconductor material as the aforementioned one constituting i-type semiconductor layer 106. The semiconductor material constituting the n-type layer or the p-type layer preferably contains a crystalline layer since it increases the light utilization efficiency and the carrier density. The concentration of hydrogen in the n-type layer or the p-type layer is preferably not higher than 5 atom %, more preferably not higher than 1 atom %.

Buffering semiconductor layers 105a, 105b, 107a, 107b are formed from a material such as a-Si:H, a-Si:F, a-Si:H:F, a-SiC:H, s-SiC:F, a-SiC:H:F, a-SGe:H, a-SiGe:F, a-SiGe:H:F, μc-Si:H, μc-SiGe:H, and μc-SiC:H. These buffering semiconductor layers are respectively formed at the interface between the n-type layer and i-type layer, and at the interface of i-type layer and the p-type layer. These layers can be formed by reacting the source material gases by changing the applied power.

The buffering semiconductor layers are named first buffering semiconductors 105a, 107a, and second buffering semiconductors 105b, 107b in the order of the layer formation. In the successive layer formation of first buffering semiconductors 105a, 107a, and second buffering semiconductors 105b, 107b by glow discharge, the potential polarity of the first cathode electrode and the potential polarity of the second cathode electrode in the space of the film formation chamber are made different from each other, or the potential polarity of one of the first and second cathode electrodes is set at zero volt. Specifically, one method of differentiating the potential polarities of plural cathode electrodes is superposition of DC voltage to the voltage applied from the AC power source. Otherwise, the potential polarity can be suitably controlled by changing the surface area of the cathode electrode larger or smaller relative to that of the anode electrode in the film formation space.

The aforementioned respective semiconductor layers can be formed by a semiconductor film deposition process such as microwave plasma CVD, RF plasma CVD, VHF plasma CVD, ion plating, sputtering, reactive sputtering, photo-assisted CVD, thermal CVD, MOCVD, MBE, and HR-CVD. The source material gases for formation of the semiconductor layers include simple substances, hydrides, halides, organometals, and so forth of the aforementioned elements, which are introducible in a gaseous state into the space of the respective film formation chambers. The source material gas may be a simple material or may be a mixture of the above materials, or may be mixedly used with a rare earth gas such as He, Ne, Ar, Kr, Xe, and Rn; or a diluent gas such as $H_2$, HF, and HCl.

(Production Apparatus)

Figure 5:
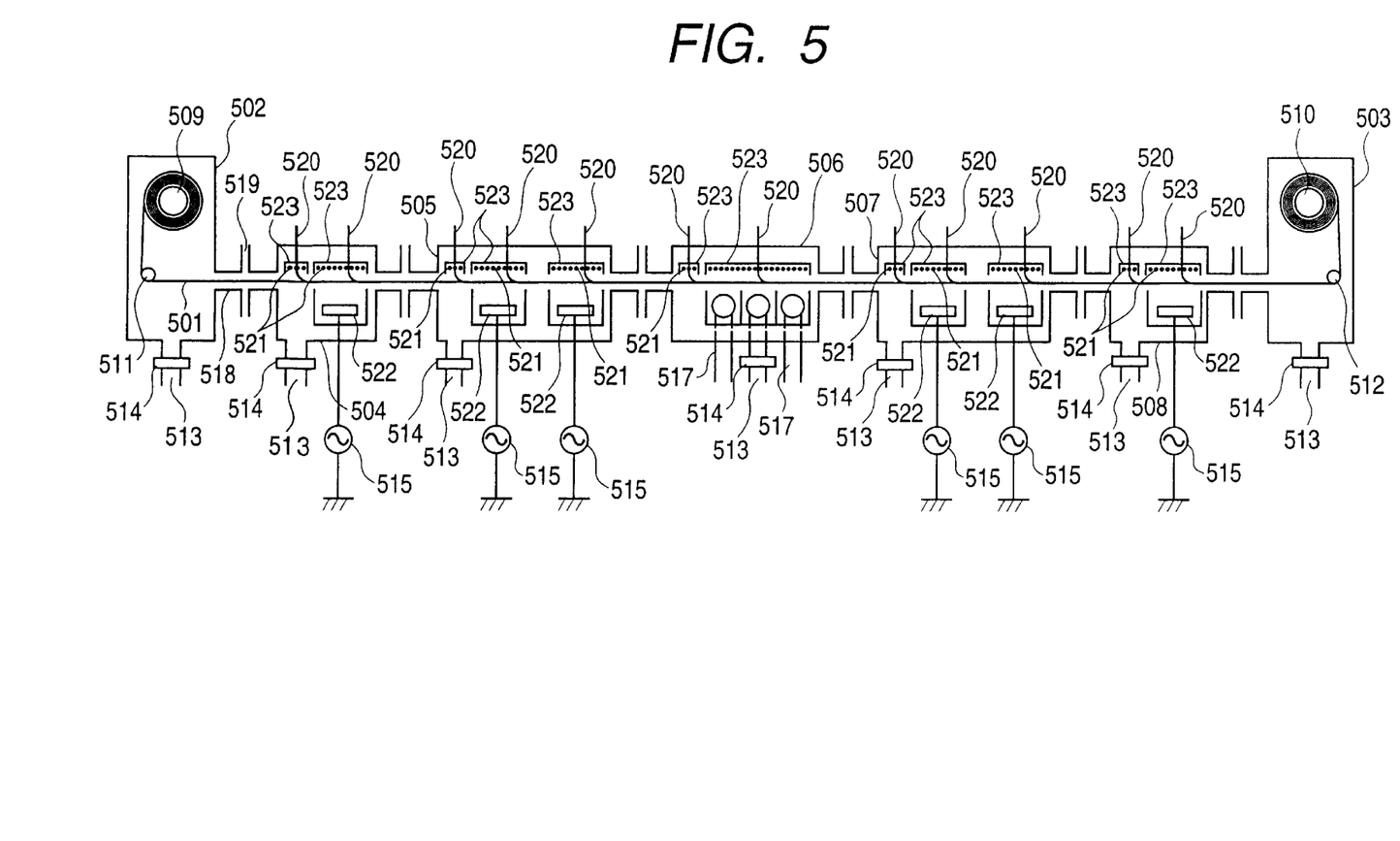
FIG. 5 is a schematic enlarged sectional view of a production apparatus for the process for producing a photovoltaic element according to the present invention.

FIG. 5 is a schematic sectional view of an example of the apparatus for continuous production of a solar cell as a photovoltaic element.

In this apparatus, feed chamber 502 and wind-up chamber 503 for belt-shaped substrate 501 are placed in opposition, and between the above two chambers, are placed layer formation chamber 504 for an n-type semiconductor layer, layer formation chamber 505 for a n/i buffering semiconductor layer, layer formation chamber 506 for an i-type semiconductor layer, layer formation chamber 507 for a p/i semiconductor layer, layer formation chamber 508 for a p-type semiconductor layer in series in the named order from the side of feed chamber 502. These layer formation chambers are connected by gas gates 518 having a gate gas introduction tube 519. Substrate 501 wound in a roll shape is unwound and delivered from feed chamber 502. With the passage of substrate 501 through the respective layer formation chambers, the respective semiconductor layers are successively formed and laminated thereon, and is wound up in a roll shape again in wind-up chamber 503.

Substrate 501 in feed chamber 502 is wound on feed bobbin 509, and is wound up on wind-up bobbin 510, and could be delivered in the reverse direction. Delivery rollers 511,512 are provided in feed chamber 501 and wind-up chamber 503 for control of tension and registration of substrate 501.

Evacuation tube 513 is connected to the respective chamber and to an evacuation pump not shown in the drawings. Throttle valve 514 is provided on the respective evacuation tube 513 to adjust the conductance. A microwave-transmitting member is provided at the tip of applicator 517. The microwave-transmitting member is connected to a microwave power source (not shown in the drawing) through a waveguide tube (not shown in the drawing). Electrodes 522 are connected respectively to RF power source 515.

Infrared heater 521 is provided in the respective layer formation chambers, and is constituted of plural infrared lamp. On the backside of the infrared lamps in the respective layer formation chamber, a lamp house 523 is provided to focus the radiated heat effectively onto substrate 501. The temperature of substrate 501 is monitored by thermocouples 520.

An interleaving sheet may be delivered along the surface of substrate 501 to protect the surface of substrate 501 by a delivery mechanism provided in feed chamber 502 and wind-up chamber 503 to feed and wind up the interleaving sheet. The material of the interleaving sheet includes a heat-resistant resin such as polyamide resins, and glass wool.

To the respective layer formation chambers, a bias voltage may be applied to control the potential of the plasma generated in the film formation space in the chamber. The bias voltage may be a DC voltage, a pulse voltage, or an AC voltage, or superposition thereof. The control of the plasma potential improves the stability and reproducibility of the plasma, which improves the film properties of the formed layers and reduces the defects of the layers.

Figure 2:
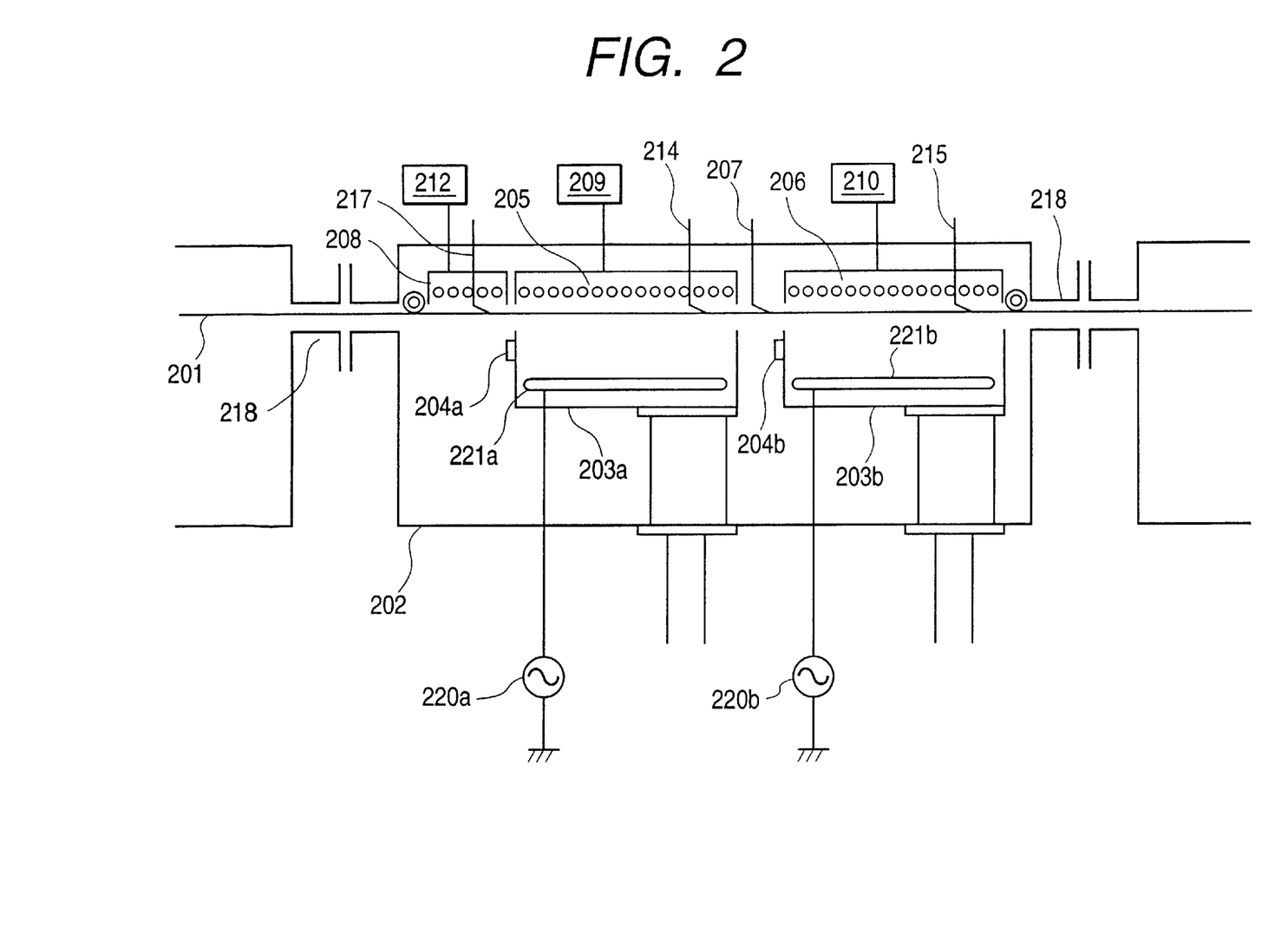
FIG. 2 is a schematic enlarged sectional view of the chamber for formation of a buffering semiconductor layer shown in FIG. 5.

Layer formation chamber 505 and layer formation chamber 507 are both a reaction chamber having the same constitution for formation of a buffering semiconductor layer. Therefore, layer formation chamber 505 is explained, and the explanation of layer formation chamber 507 is omitted. FIG. 2 is a schematic sectional view of layer formation chamber 505.

Layer formation chamber 505 (202 in FIG. 2) for a buffering semiconductor layer has therein first film formation vessel 203a and second film formation vessel 203b in a box shape with the upper face opened. Substrate 201 is allowed to pass through the space above first and second film formation vessels 203a, 203b. With the passage of substrate 201, a buffering semiconductor layer is formed on the confronting face (lower side face of substrate 201). This layer formation chamber 202, and first and second film formation vessels 203a, 203b therein are made of a metal, and are connected electrically with each other.

Substrate 201 is delivered through gas gate 218 on the feed side (left side in FIG. 2) of layer formation chamber 202, allowed to pass through the space above first and second film formation vessels 203a, 203b, carried out through gas gate 218 on the take-out side of layer formation chamber 202, and delivered to the next layer formation chamber.

In first and second film formation chambers 203a, 203b, first cathode electrode 221a and second cathode electrode 221b are provided at the lower portion thereof. First and second cathode electrodes 221a,221b are respectively connected to first RF power source 220a and second RF power source 221b. To first and second film formation vessel 203a, 203b, first gas introduction tube 204a and second gas introduction tube 204b are connected to supply the source material gases. These gas introduction tubes are connected to gas-supplying installation on the upstream side, and emit the source material gases through many gas emission openings provided on the downstream side onto substrate 201.

Above first and second film formation vessels 203a, 203b, on the reverse side (upper side) of substrate 201, infrared heater 208 for preliminary heating, and first infrared heater 205 and second infrared heater 206 for temperature control are provided in this order in the delivery direction, and thermocouples 217, 214, 215 are provided thereto so as to be in contact with substrate 201. Additionally, thermocouple 207 is provided between infrared heater 205 and infrared heater 206 so as to be in contact with substrate 201. Infrared heater 208 is controlled by temperature controller 212, and first and second infrared heaters 205, 206 are controlled respectively by first temperature controller 209 and second temperature controller 210. In heating the substrate 201 from the reverse side, the substrate is preliminarily heated by infrared heater 208 to the prescribed film formation temperature, and the temperature during the film formation is kept constant by first and second infrared heaters 205, 206.

Next, layer formation chamber 506 for i-type semiconductor layer is explained by reference to FIG. 3 which is a schematic perspective view thereof. Inside the layer formation chamber 506 for the i-type semiconductor layer, first, second and third film formation space 302 in a box shape are connected with the upper faces thereof opened. Substrate 301 is delivered through the upper portions of first, second, and third film formation space 302, whereby i-type semiconductor layer is formed on the confronting face (lower face) of substrate 301. The layer formation chamber and the outside walls of first, second, and third film formation space 302 are all made of metal.

Figure 3:
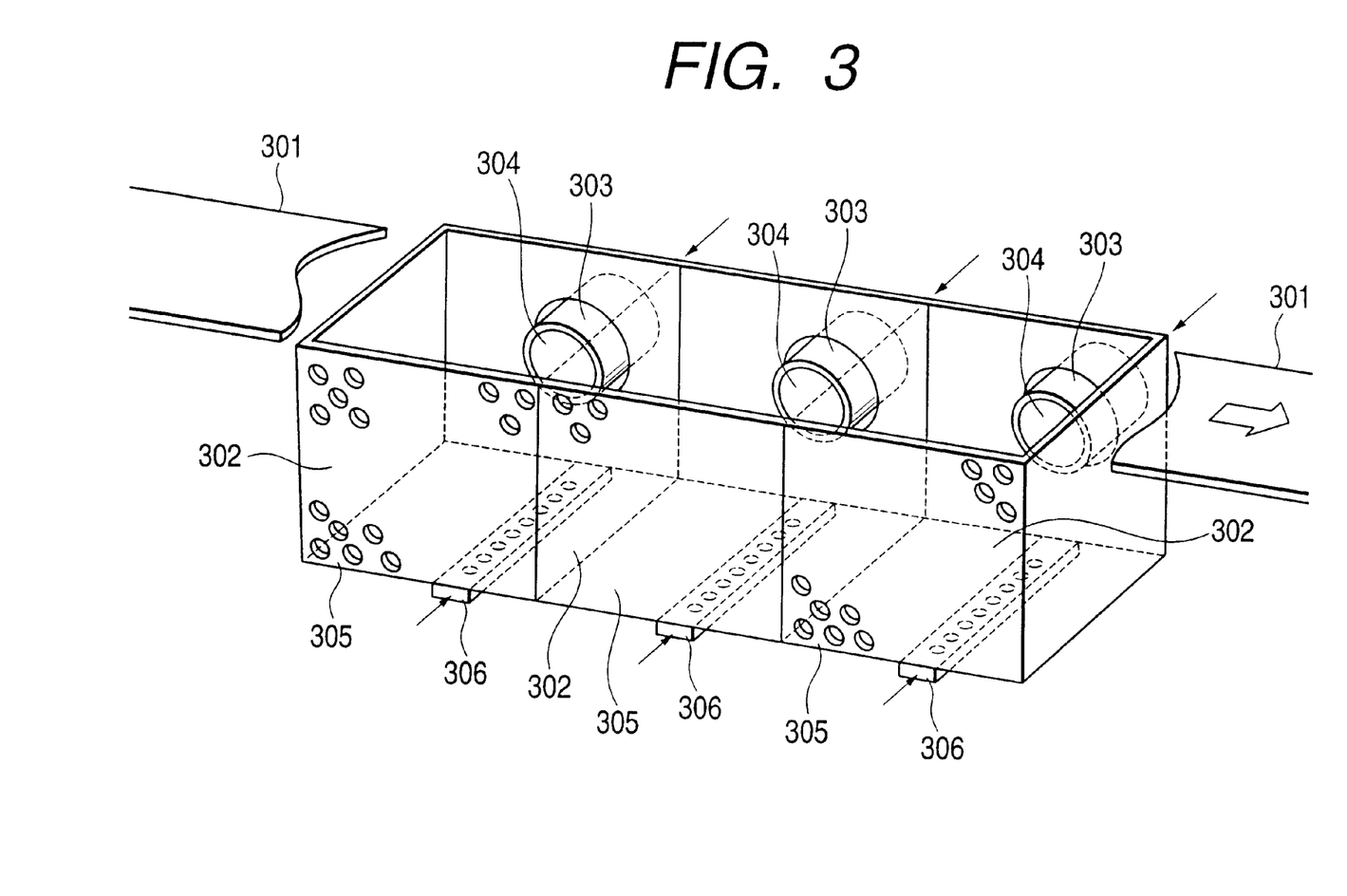
FIG. 3 is a schematic enlarged sectional view of the chamber for formation of an i-type semiconductor layer shown in FIG. 5.

Substrate 301 is delivered from a gas gate (not shown in the drawings) on the feed side (left side in FIG. 3) into the layer formation chamber, allowed to pass through the upper space of first, second, and third film formation space 302, discharged through a gas gate (not shown in the drawing) on the take-out side of the layer formation chamber (right side in FIG. 3).

On the side walls of first, second, and third film formation spaces 302, first, second, and third applicators 303 are provided along the direction of delivery of substrate 301. Respective applicators 303 apply microwave energy to the film formation spaces. To the respective applicators, a tip of a wave guide tube connected to a microwave power source is connected. The portions of connection of applicators 303 to the film formation spaces are constituted respectively of microwave-transmitting member 304.

To the bottoms of first, second, and third film formation spaces 302, first, second, and third gas introduction tubes 306 are connected, and the upstream ends of the tubes are connected to a gas supplying installation. The source material gas is emitted through many gas emission opening onto substrate 301.

For each of first, second, and third film formation spaces 302, evacuation punching boards 305 are attached to the side face confronting the applicators 303 to enclose microwave energy in the film formation space. These are connected to evacuation throttle valves connected to evacuation tube not shown in the drawing.

Figure 4:
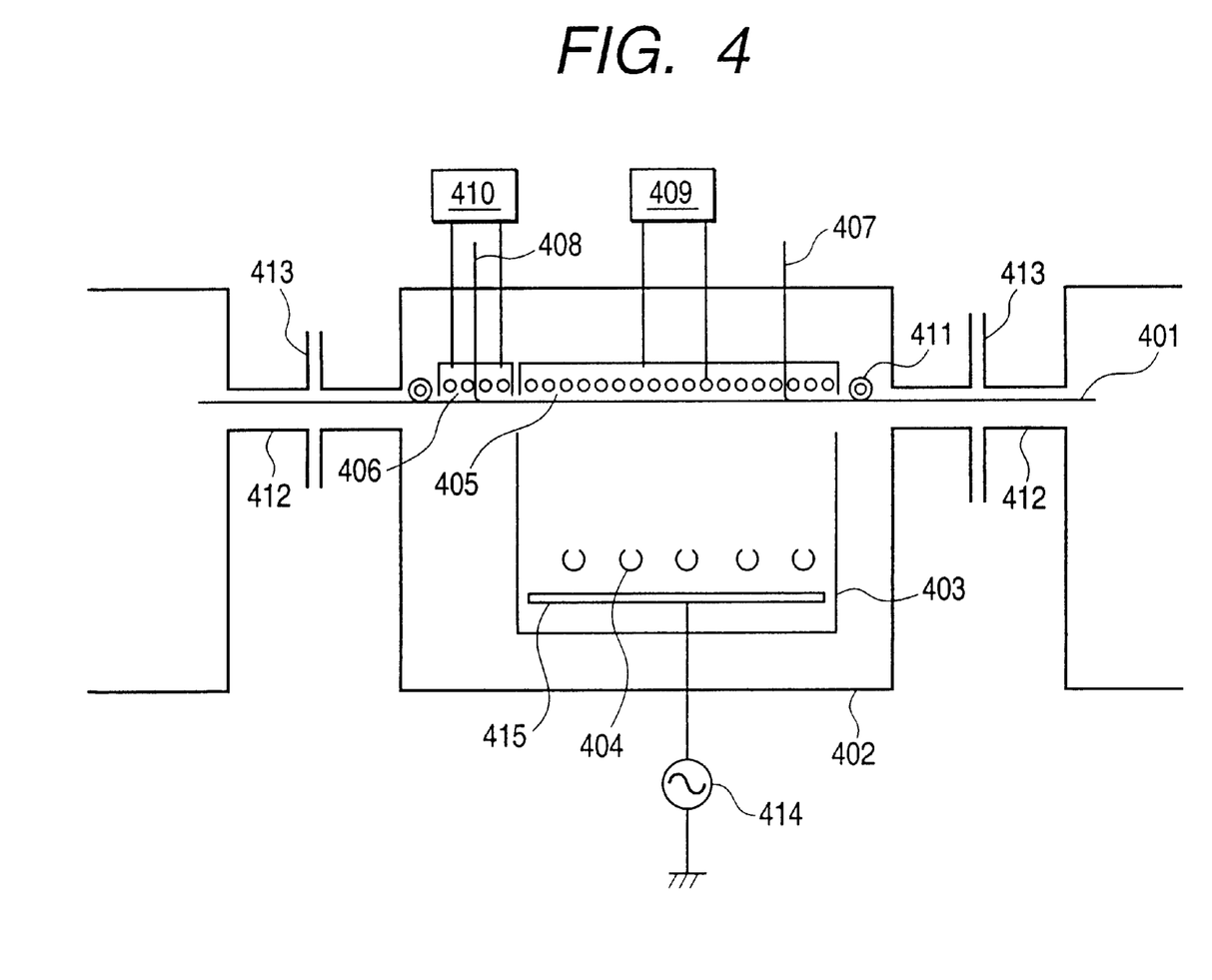
FIG. 4 is a schematic enlarged sectional view of the chamber for formation of an n-type semiconductor layer shown in FIG. 5.

Layer formation chamber 504 for an n-type semiconductor layer and layer formation chamber 508 for a p-type semiconductor layer are the same in the construction. Therefore, layer formation chamber 504 is explained, and explanation of layer formation chamber 508 is omitted. FIG. 4 is a schematic sectional view of layer formation chamber 504.

In FIG. 4, layer formation chamber 402 (504) contains therein film formation vessel 403 in a box shape with its upper face opened. Substrate 401 supported by substrate-supporting roller 411 is allowed to pass through the upper portion of the space above the film formation vessel 403. Thereby, a semiconductor layer is formed on the confronting face (lower side face) of substrate 401. This layer formation chamber 402 and film formation vessel 403 inside are both made of a metal and are connected electrically with each other.

Substrate 401 is introduced from gas gate 412 on the feed side of layer formation chamber 402 (left side in FIG. 4), allowed to pass through the space above film formation vessel 403, discharged through gas gate 412 at the take-out side of layer formation chamber 402 (right side in FIG. 4), and introduced to the next layer formation chamber, and so forth. The numeral 413 indicates a gate gas introduction tube.

Film formation vessel 403 is provided, at the inside lower portion thereof, with cathode 415 which is connected to RF power source 414. To film formation vessel 403, gas introduction tube 404 is connected for introducing a source material gas. The upstream end of the gas introduction tube 404 is connected to a gas supply installation, and the source material gas is emitted from gas emission holes toward substrate 401.

Above film formation vessel 403, on the reverse side (upper side) of substrate 401, are provided infrared heater 406 for preliminary heating, and infrared heater 405 for the temperature control in the successively from the side of feed of substrate 401. Thermocouples 407,408 are provided for the respective infrared heater so as to be in contact with substrate 401. Infrared heater 406 is controlled by temperature controller 410, and infrared heater 405 is controlled by temperature controller 409. Thereby, substrate 410 is preliminarily heated by infrared heater 406, and is controlled to be constant at a prescribed film formation temperature from the reverse face side of substrate 401.

The process for producing a photovoltaic element is explained below by Examples.

EXAMPLE 1

A process for continuous production of a solar cell of the present invention with the apparatus shown in FIG. 5 is described in this Example.

(1) Substrate 501 wound up on feed bobbin 509 was set in feed chamber 502. This substrate 501 was delivered to the respective gas gates 518 to pass through the respective layer formation chambers 504, 505, 506, 507, 508 successively, and was wound up by wind-up bobbin 510 in wind-up chamber 503 with suitable adjustment of the tension not to cause loosening.

Substrate 501 was SUS430BA having a thickness of 0.2 mm, a breadth of 300 mm, and a length of 300 m. This substrate had been degreased and washed sufficiently, and on the surface thereof, thin Al film of 100 nm and thin ZnO film of 1 $\mu$m thick had been vapor-deposited by sputtering as back reflection layer 103 and a transparent electroconductive layer.

(2) Respective chambers 502 to 508 were evacuated to a vacuum of $1 \times 10^{-6}$ Torr by a vacuum pump.

(3) Heat treatment before film formation.

To the respective gas gates 518, gate gas ($H_2$) was introduced through gate gas introduction tubes 519 at a rate of 500 cc/min, and to the respective film formation vessels, He was introduced through gas introduction tubes at a rate of 500 cc/min with the inside pressure of chambers 502–508 controlled at 1.0 Torr. The pressure was controlled by adjusting the opening degree of the respective throttle valves 514 in evacuation of the respective chambers through evacuation tubes 513 by a vacuum pump.

Thereafter, infrared heaters for preliminary heating in layer formation chambers 504–508 were actuated to heat the substrate 501 and the internal materials to 400° C. This state was kept for at least 3 hours.

(4) The respective chambers 502 to 508 were evacuated to a pressure of $1 \times 10^{-6}$ Torr or a higher vacuum by a vacuum pump.

(5) Introduction of gate gas in film formation

Gate gas ($H_2$) was introduced to the respective gas gates 518 through gate gas introduction tubes 519 at a rate of 500 cc/min.

(6) Arrangement for formation of n-type semiconductor layer 104

In layer formation chamber 402 shown in FIG. 4 (corresponding to chamber 504 in FIG. 5), temperature controller 410 for preliminary heating was actuated to heat substrate 401 by infrared heater 406 at the heating temperature set at 250° C. Then temperature controller 409 was actuated to heat substrate 401 by infrared heater 405 at the heating temperature set at 270° C.

Source material gases were introduced into the space of layer formation vessel 403 through gas introduction tube 404 from a gas supply installation. In this Example, $SiH_4$ gas was introduced at a rate of 100 cc/min, $PH_3/H_2$ gas ($PH_3$: 1%) at a rate of 500 cc/min, $H_2$ gas at a rate of 700 cc/min. The inside pressure of film formation vessel 403 was controlled at 1.0 Torr. The pressure control was conducted by adjusting the opening degree of the respective throttle valves 514 connected to layer formation chamber 402 in evacuation of the respective chambers through evacuation tube 513 by a vacuum pump.

RF power source 414 was actuated at an output level set at 100 W to generate electric discharge through cathode electrode 415 in film formation vessel 403.

(7) Arrangement for formation of n/i buffering semiconductor layers 105a, 105b

In layer formation chamber 202 shown in FIG. 2 (corresponding to chamber 505 in FIG. 5), temperature controller 212 for preliminary heating was actuated to heat substrate 201 by infrared heater 208 at the heating temperature set at 260° C. Then first temperature controller 209 was actuated to heat substrate 201 by first infrared heater 205 at the heating temperature set at 260° C., and second temperature controller 210 was actuated to heat substrate 201 by second infrared heater 206 at the heating temperature set at 300° C.

Source material gases were introduced into first layer formation vessel 203*a*. Specifically, the source material gases were introduced through first gas introduction tube 204*a* from a gas supply installation into the space in first film formation vessel 203*a*: SiH$_4$ gas at a rate of 50 cc/min, and H$_2$ gas at a rate of 1000 cc/min. The inside pressure of first film formation vessel 203*a* was controlled at 1.1 Torr. The pressure was controlled by adjusting the opening degree of the throttle valve provided for the vessel in evacuation by a vacuum pump.

First RF power source 220*a* was actuated at an output level set at 50 W. Simultaneously a DC power source (not shown in the drawing) connected to first cathode electrode 221*a* was actuated. Thereby the RF voltage and the DC voltage of +100 V were applied in superposition to first cathode electrode 221*a* to generate electric discharge in first film formation vessel 203*a*.

Source material gases were introduced into second layer formation vessel 203*b*. Specifically, the source material gases were introduced from a gas supply installation through second gas introduction tube 204*b* into the space in second film formation vessel 203*b*: SiH$_4$ gas at a rate of 100 cc/min, and H$_2$ gas at a rate of 300 cc/min. The inside pressure of second film formation vessel 203*b* was controlled at 1.1 Torr. The pressure was controlled by adjusting the opening degree of the throttle valve provided for the vessel in evacuation by a vacuum pump.

Second RF power source 220*b* was actuated at an output level set at 100 W to generate electric discharge in second film formation vessel 203*b* through second cathode electrode 221*b*. The bias voltage was −21 V.

(8) Arrangement for formation of i-type semiconductor layer 106

A temperature controller for preliminary heating was actuated to heat substrate 501 by an infrared heater at the heating temperature set at 350° C. Then the temperature controller was actuated to heat substrate 501 by an infrared heater at the heating temperature set at 360° C.

Source material gases were introduced into the space of the first, second, and third layer formation vessels 302 through first, second, and third gas introduction tubes 306 from a gas supply installation: SiH$_4$ gas at a rate of 80 cc/min, GeH$_4$ gas at 90 cc/min, and H$_2$ gas at 200 cc/min. The inside pressure of each of the film formation vessels was controlled at 0.02 Torr. The pressure was controlled by adjusting the opening degree of the respective throttle valves in evacuation of the respective chambers through an evacuation pipe by a vacuum pump.

First, second, and third microwave power sources were actuated respectively at an output level set at 200 W to introduce the microwave power to applicators 303 to generate electric discharge through microwave transmissive members 304 in the respective film formation vessels.

(9) Arrangement for formation of p/i buffering semiconductor layers 107*a*, 107*b*

In layer formation chamber 202 shown in FIG. 2 (corresponding to chamber 507 in FIG. 5), temperature controller 212 for preliminary heating was actuated to heat substrate 201 by infrared heater 208 at the heating temperature set at 360° C. Then first temperature controller 209 was actuated to heat substrate 201 by first infrared heater 205 at the heating temperature set at 380° C., and second temperature controller 210 was actuated to heat substrate 201 by second infrared heater 206 at the heating temperature set at 200° C.

Source material gases were introduced into first layer formation vessel 203*a*. Specifically, the source material gases were introduced from a gas supply installation through first gas introduction tube 204*a* into the space in first film formation vessel 203*a*: SiH$_4$ gas at a rate of 150 cc/min, and H$_2$ gas at a rate of 1500 cc/min. The inside pressure of first film formation vessel 203*a* was controlled at 1.1 Torr. The pressure was controlled by adjusting the opening degree of the throttle valve provided for the vessel in evacuation by a vacuum pump.

First RF power source 220*a* was actuated at an output level set at 200 W to generate electric discharge through first cathode electrode 221*a* in first film formation vessel 203*a*. A bias voltage of −54 V was applied thereto.

Source material gases were introduced into second layer formation vessel 203*b*. Specifically, the source material gases were introduced from a gas supply installation through second gas introduction tube 204*b* into the space in second film formation vessel 203*b*: SiH$_4$ gas at a rate of 40 cc/min, and H$_2$ gas at a rate of 1500 cc/min. The inside pressure of second film formation vessel 203*b* was controlled at 1.1 Torr. The pressure was controlled by adjusting the opening degree of a throttle valve provided for the vessel in evacuation by a vacuum pump.

Second RF power source 220*b* was actuated at an output level set at 1800 W. Simultaneously a DC power source (not shown in the drawing) connected to first cathode electrode was actuated. Thereby the RF voltage and the DC voltage of +200 V were applied in superposition to second cathode electrode 221*b* to generate electric discharge in second film formation vessel 203*b*.

(10) Arrangement for formation of p-type semiconductor layer 108

In layer formation chamber 402 shown in FIG. 4 (corresponding to chamber 508 in FIG. 5), temperature controller 410 for preliminary heating was actuated to heat substrate 401 by infrared heater 406 at the heating temperature set at 270° C. Then temperature controller 409 was actuated to heat substrate 401 by infrared heater 405 at the heating temperature set at 270° C.

Source material gases were introduced from a gas supply installation through gas introduction tube 404 into the space of layer formation vessel 403: SiH$_4$ gas at a rate of 10 cc/min, BF$_3$/H$_2$ gas (BF$_3$: 1%) at 500 cc/min, and H$_2$ gas at 6000 cc/min. The inside pressure of film formation vessel 403 was controlled at 1.0 Torr. The pressure was controlled by adjusting the opening degree of throttle valve 514 in evacuation of the chamber 402 through evacuation tube 413 by a vacuum pump.

RF power source 414 was actuated at an output level set at 1500 W to generate electric discharge through cathode electrode 415 in film formation vessel 403.

(11) Substrate 501 was delivered from feed chamber 502 to wind-up chamber 503 at a delivery rate of 2000 mm/min. During the delivery, n-type semiconductor layer 104, n/i buffering semiconductor layers 105*a*,105*b*, i-type semiconductor layer 106, p/i buffering semiconductor layer 107*a*, 107*b*, and p-type semiconductor layer 108 were formed on substrate 501.

(12) When one roll of substrate 501 has been entirely delivered, the energization for plasma generation, gas feed, and infrared heater was completely stopped. Then, N$_2$ gas for remaining gas leakage was introduced into the chambers to restore the pressure to atmospheric pressure. Thereafter substrate 501 wound up by wind-up bobbin 510 was taken out of the apparatus.

(13) Formation of transparent electrode 109 and collector electrode 110

On p-type semiconductor layer 108 formed on substrate 501 taken out from the apparatus, transparent electrode 109 was formed by vapor-depositing ITO ($In_2O_3+SnO_2$) in a thickness of 100 nm by vacuum vapor deposition. Further, on a prescribed position on transparent electrode 109, collector electrode 110 was formed by vacuum vapor deposition of Al in a thickness of 2 $\mu$m. The substrate was cut into sheets in a size of 36 cm×22 cm.

The solar cell having the lamination structure shown in FIG. 1 was prepared according to the procedure above. This solar cell was named Sample 1. The production conditions are shown in Table 1.

voltage characteristics by application of DC voltage to output electrode 111, the open-circuit voltage, the fill factor, and the photoelectric conversion efficiency $\eta$.

Consequently, Sample 1 was superior to Comparative Sample 1 in the open-circuit voltage by a factor of 1.12 in average, in the fill factor by 1.1 in average, and in the photoelectric conversion efficiency $\eta$ by a factor of 1.29 in average.

The sheets of Sample 1 and Comparative Sample 1 were vacuum-sealed with a protection film composed of polyvinylidene fluoride (VDF), and is placed in the outdoors with connection of fixed resistance of 50 $\Omega$ to the both electrodes to keep practical application conditions. After one years of practical application test, photoelectric conversion efficiencies $\eta$ were measured. Therefrom, deterioration ratios by light exposure were derived, namely the ratio of the drop of

TABLE 1

Production Conditions in Example 1

| | |
|---|---|
| Substrate: | SUS430BA, 300 mm broad, 0.2 mm thick |
| Back reflection layer: | Aluminum (Al) thin film, 100 nm |
| Transparent electroconductive layer: | Zinc oxide (ZnO) thin film, 1 $\mu$m |
| Gate gas: | $H_2$ 500 cc/min, each gate |

| Name of Layer | | Gas Flow Rate (cc/min) | Discharge power (W) | Pressure (Torr) | Substrate temp (° C.) | Bias value (V) |
|---|---|---|---|---|---|---|
| n-Type semiconductor layer | $SiH_4$ | 100 | 100 (RF) | 1.0 | 250 | −15 |
| | $PH_3/H_2$ ($PH_3$:1%) | 500 | | | | |
| | $H_2$ | 700 | | | | |
| First n/i buffering semiconductor layer | $SiH_4$ | 50 | 50 (RF) | 1.1 | 260 | +100 |
| | $H_2$ | 1000 | | | | |
| Second n/i buffering semiconductor layer | $SiH_4$ | 100 | 100 (RF) | 1.1 | 300 | −21 |
| | $H_2$ | 300 | | | | |
| i-Type semiconductor layer | $SiH_4$ | 80 | 200 ($\mu$W) | 0.02 | 360 | +150 |
| | $GeH_4$ | 90 | 200 | | | +150 |
| | $H_2$ | 200 | 200 | | | +150 |
| First p/i buffering semiconductor layer | $SiH_4$ | 150 | 200 (RF) | 1.1 | 380 | −54 |
| | $H_2$ | 1500 | | | | |
| Second p/i buffering semiconductor layer | $SiH_4$ | 40 | 1800 (RF) | 1.1 | 200 | +200 |
| | $H_2$ | 1500 | | | | |
| p-Type semiconductor layer | $SiH_4$ | 10 | 1500 (RF) | 1.0 | 270 | +120 |
| | $BF_3/H_2$ ($BF_3$:1%) | 500 | | | | |
| | $H_2$ | 6000 | | | | |

| | |
|---|---|
| Transparent electrode: | ITO ($In_2O_3 + SnO_2$) thin film, 100 nm |
| Collector electrode: | Aluminum (Al) thin film, 2 $\mu$m |

COMPARATIVE EXAMPLE 1

A solar cell was produced in the same manner as in Example 1, except that the polarity of the bias voltage of the cathode electrode is not changed in the steps of formation of the buffering semiconductor layers. Specifically, in Step (7), the bias voltage of first cathode electrode 221a was −10 V without superposition of DC voltage, and in Step (9), the bias voltage of second cathode electrode 221b was −100 V without superposition of DC voltage. The solar cell produced in the process above is named Comparative Sample 1.

(Evaluation)

Firstly, photoelectric conversion efficiency $\eta$: [Maximum power generation per unit area (mW/cm$^2$)]/[Projected light intensity per unit area (mW/cm$^2$)] was measured of Sample 1 produced in Example 1 and Comparative Sample produced in Comparative Example 1.

Five sheets of Samples were prepared respectively for Sample 1 and Comparative Sample 1. These sample sheets were subjected, under exposure to simulated sunlight of AM-1.5 (100 mW/cm$^2$), to measurement of the currentthe photoelectric conversion efficiency $\eta$ by the deterioration test to the one before the deterioration test. As the results, the deterioration ratio of Sample 1 was as low as 23% of that of Comparative Sample 1.

From the above results, the solar cell produced according to the present invention was found to be improved remarkably in the photoelectric conversion efficiency, and the initial performances to be maintained for a long time.

EXAMPLE 2

A solar cell was produced in the same manner as in Example 1 except that the production conditions were changed as shown in Table 2.

The important differences from Example 1 are that, in step (7) for formation of n/i buffering semiconductor layer 105a, DC voltage of zero volt was superposed to first cathode electrode 221a to make the bias voltage zero volt, and that first p/i buffering semiconductor layer 107a was formed from a-SiGe:H. The solar cell produced was named Sample 2.

TABLE 2

Production Conditions in Example 2

| Substrate: | SUS430BA, 300 mm broad, 0.2 mm thick |
|---|---|
| Back reflection layer: | Aluminum (Al) thin film, 100 nm |
| Transparent electroconductive layer: | Zinc oxide (ZnO) thin film, 1 μm |
| Gate gas: | $H_2$ 500 cc/min, each gate |

| Name of Layer | | Gas Flow Rate (cc/min) | Discharge power (W) | Pressure (Torr) | Substrate temp (° C.) | Bias value (V) |
|---|---|---|---|---|---|---|
| n-Type semiconductor layer | $SiH_4$ | 80 | 80 (RF) | 1.0 | 250 | −12 |
| | $PH_3/H_2$ ($PH_3$:1%) | 400 | | | | |
| | $H_2$ | 700 | | | | |
| First n/i buffering semiconductor layer | $SiH_4$ | 50 | 50 (RF) | 1.1 | 260 | 0 |
| | $H_2$ | 1000 | | | | |
| Second n/i buffering semiconductor layer | $SiH_4$ | 100 | 100 (RF) | 1.1 | 300 | −21 |
| | $H_2$ | 300 | | | | |
| i-Type semiconductor layer | $SiH_4$ | 90 | 150 (μW) | 0.015 | 340 | +100 |
| | $GeH_4$ | 80 | 150 | | | +100 |
| | $H_2$ | 200 | 150 | | | +100 |
| First p/i buffering semiconductor layer | $SiH_4$ | 150 | 200 (RF) | 1.1 | 380 | −54 |
| | $H_2$ | 1500 | | | | |
| | $GeH_4$ | 10 | | | | |
| Second p/i buffering semiconductor layer | $SiH_4$ | 40 | 1800 (RF) | 1.1 | 200 | +200 |
| | $H_2$ | 1500 | | | | |
| p-Type semiconductor layer | $SiH_4$ | 10 | 1500 (RF) | 1.0 | 270 | +125 |
| | $BF_3/H_2$ ($BF_3$:1%) | 500 | | | | |
| | $H_2$ | 6000 | | | | |

| Transparent electrode: | ITO ($In_2O_3$ + $SnO_2$) thin film, 100 nm |
|---|---|
| Collector electrode: | Aluminum (Al) thin film, 2 μm |

COMPARATIVE EXAMPLE 2

A solar cell was produced in the same manner as in Example 2, except that the polarity of the bias voltage of the cathode electrode was not changed in the steps of formation of the buffering semiconductor layers. Specifically, in Step (7) for formation of n/i buffering semiconductor layer 105a, the bias voltage of first cathode electrode 221a was −10 V without superposition of DC voltage, and in Step (9), the bias voltage of second cathode electrode 221b was −100 V without superposition of DC voltage. The solar cell produced by the process above was named Comparative Sample 2.

(Evaluation)

Sample 2 produced in Example 2 and Comparative Sample 2 produced in Comparative Example 2 were evaluated in the same manner as in Example 1 and Comparative Example 1. Consequently, Sample 2 was superior to Comparative Sample 2 with the open-circuit voltage by a factor of 1.18 in average, the fill factor by 1.1 in average, and the photoelectric conversion efficiency η by a factor of 1.3 in average. The deterioration ratio of Sample 2 was 50% of that of Comparative Sample 2.

From the above results, the solar cell, which has the first p/i buffering semiconductor layer of a-SiGe:H, produced according to the present invention was found to be improved remarkably in the photoelectric conversion efficiency, and the initial performances to be maintained for a long time also.

EXAMPLE 3

A solar cell was produced in the same manner as in Example 1 except that, in step (7) for formation of n/i buffering semiconductor layer 105a, DC voltage is not superposed to first cathode electrode 221a to make the bias voltage −10 V as shown in Table 3. The solar cell produced was named Sample 3.

TABLE 3

Production Conditions in Example 3

| Substrate: | SUS430BA, 300 mm broad, 0.2 mm thick |
|---|---|
| Back reflection layer: | Aluminum (Al) thin film, 100 nm |
| Transparent electroconductive layer: | Zinc oxide (ZnO) thin film, 1 μm |
| Gate gas: | $H_2$ 500 cc/min, each gate |

| Name of Layer | | Gas Flow Rate (cc/min) | Discharge power (W) | Pressure (Torr) | Substrate temp (° C.) | Bias value (V) |
|---|---|---|---|---|---|---|
| n-Type semiconductor layer | $SiH_4$ | 100 | 100 (RF) | 1.0 | 250 | −15 |
| | $PH_3/H_2$ ($PH_3$:1%) | 500 | | | | |
| | $H_2$ | 700 | | | | |
| First n/i buffering semiconductor layer | $SiH_4$ | 50 | 50 (RF) | 1.1 | 260 | −10 |
| | $H_2$ | 1000 | | | | |

TABLE 3-continued

| | | | | | | | |
|---|---|---|---|---|---|---|---|
| Second n/i buffering semiconductor layer | SiH$_4$ H$_2$ | 100 300 | 100 (RF) | 1.1 | 300 | −21 | |
| i-Type semiconductor layer | SiH$_4$ GeH$_4$ H$_2$ | 80 90 200 | 200 (μW) 200 200 | 0.02 | 360 | +150 +150 +150 | |
| First p/i buffering semiconductor layer | SiH$_4$ H$_2$ | 150 1500 | 200 (RF) | 1.1 | 380 | −54 | |
| Second p/i buffering semiconductor layer | SiH$_4$ H$_2$ | 40 1500 | 1800 (RF) | 1.1 | 200 | +200 | |
| p-Type semiconductor layer | SiH$_4$ BF$_3$/H$_2$ (BF$_3$:1%) H$_2$ | 10 500 6000 | 1500 (RF) | 1.0 | 270 | +120 | |

| | |
|---|---|
| Transparent electrode: | ITO (In$_2$O$_3$ + SnO$_2$) thin film, 100 nm |
| Collector electrode: | Aluminum (Al) thin film, 2 μm |

COMPARATIVE EXAMPLE 3

A solar cell was produced in the same manner as in Example 3, except that the polarity of the bias voltage of the cathode electrode was not changed in the step of formation of the buffering semiconductor layer. Specifically, in Step (9), the bias voltage of second cathode electrode 221b was −100 V without superposition of DC voltage. The solar cell produced in the process above was named Comparative Sample 3.

(Evaluation)

Sample 3 produced in Example 3 and Comparative Sample 3 produced in Comparative Example 3 were evaluated in the same manner as in Example 1 and Comparative Example 1. Consequently, Sample 3 was superior to Comparative Sample 3 with the open-circuit voltage by a factor of 1.08 in average, the fill factor by 1.15 in average, and the photoelectric conversion efficiency η by a factor of 1.2 in average. The deterioration ratio of Sample 3 was as low as 36% of that of Comparative Sample 3.

From the above results, the solar cell produced according to the present invention was found to be improved remarkably in the photoelectric conversion efficiency, and the initial performances was found to be maintained for a long time, even when the change of the polarity of the bias voltage in the buffering semiconductor layer formation from that in the formation of the semiconductor layer formation to be joined by lamination is conducted only for the p/i buffering semiconductor layer formation.

EXAMPLE 4

In the solar cell of this Example 4, three pin junctions were provided in lamination, differently from Example 1–3 in which only one pin junction was formed on the face of back reflection layer 103. The solar cell having three pin junctions in lamination is called a triple type solar cell.

Table 4 shows the production conditions in Example 4. The semiconductor layers were formed in the order of the columns from the top to the bottom in Table 4. In this Example 4, the i-type semiconductor layer was an a-SiGe:H layer respectively in the first and second pin junctions, and was an a-Si:H layer in the third pin junction. The buffering semiconductor layer is not formed in the third pin junction at the light introduction side. The discharge for formation of the i-type semiconductor layers was RF discharge.

In formation of the buffering semiconductor layers in the first pin junction, the first n/i buffering semiconductor layer was formed by superposition of DC voltage of +100 V to the first cathode electrode, and the second p/i buffering semiconductor layer was formed by superposition of DC voltage of +200 V to the second cathode electrode. In the second pin junction, the first n/i buffering semiconductor layer was formed by superposition of DC voltage of zero volt to the first cathode electrode to apply bias voltage of zero volt, and the second p/i buffering semiconductor layer was formed by superposition of DC voltage of +200 V to the second cathode electrode.

TABLE 4

Production Conditions in Example 4

| | |
|---|---|
| Substrate: | SUS430BA, 300 mm broad, 0.2 mm thick |
| Back reflection layer: | Aluminum (Al) thin film, 100 nm |
| Transparent electroconductive layer: | Zinc oxide (ZnO) thin film, 1 μm |
| Gate gas: | H$_2$ 500 cc/min, each gate |

| Name of Layer | | Gas Flow Rate (cc/min) | Discharge power (W) | Pressure (Torr) | Substrate temp (° C.) | Bias value (V) |
|---|---|---|---|---|---|---|
| n-Type semiconductor layer | SiH$_4$ PH$_3$/H$_2$ (PH$_3$:1%) H$_2$ | 100 500 700 | 100 (RF) | 1.0 | 250 | −12 |
| First n/i buffering semiconductor layer | SiH$_4$ H$_2$ | 50 1000 | 50 (RF) | 1.1 | 260 | +100 |
| Second n/i buffering semiconductor layer | SiH$_4$ H$_2$ | 100 300 | 100 (RF) | 1.1 | 300 | −21 |
| i-Type semiconductor layer | SiH$_4$ GeH$_4$ H$_2$ | 80 90 200 | 200 (μW) 200 200 | 0.02 | 360 | +150 +150 +150 |

TABLE 4-continued

| | | | | | | |
|---|---|---|---|---|---|---|
| First p/i buffering semiconductor layer | SiH$_4$<br>H$_2$ | 150<br>1500 | 200 (RF) | 1.1 | 380 | −54 |
| Second p/i buffering semiconductor layer | SiH$_4$<br>H$_2$ | 40<br>1500 | 1800 (RF) | 1.1 | 200 | +200 |
| p-Type semiconductor layer | SiH$_4$<br>BF$_3$/H$_2$ (BF$_3$:1%)<br>H$_2$ | 10<br>500<br>6000 | 1500 (RF) | 1.0 | 270 | +120 |
| n-Type semiconductor layer | SiH$_4$<br>PH$_3$/H$_2$ (PH$_3$:1%)<br>H$_2$ | 80<br>400<br>700 | 80 (RF) | 1.0 | 250 | −12 |
| First n/i buffering semiconductor layer | SiH$_4$<br>H$_2$ | 50<br>1000 | 50 (RF) | 1.1 | 260 | 0 |
| Second n/i buffering semiconductor layer | SiH$_4$<br>H$_2$ | 100<br>300 | 100 (RF) | 1.1 | 300 | −21 |
| i-Type semiconductor layer | SiH$_4$<br>GeH$_4$<br>H$_2$ | 90<br>80<br>200 | 150 (μW)<br>150<br>150 | 0.02 | 340 | +100<br>+100<br>+100 |
| First p/i buffering semiconductor layer | SiH$_4$<br>H$_2$ | 150<br>1500 | 200 (RF) | 1.1 | 380 | −54 |
| Second p/i buffering semiconductor layer | SiH$_4$<br>H$_2$ | 40<br>1500 | 1800 (RF) | 1.1 | 200 | +200 |
| p-Type semiconductor layer | SiH$_4$<br>BF$_3$/H$_2$ (BF$_3$:1%)<br>H$_2$ | 10<br>500<br>6000 | 1500 (RF) | 1.0 | 270 | +125 |
| n-Type semiconductor layer | SiH$_4$<br>PH$_3$/H$_2$ (PH$_3$:1%)<br>H$_2$ | 80<br>400<br>700 | 100 (RF) | 1.0 | 300 | −17 |
| i-Type semiconductor layer | SiH$_4$<br>H$_2$ | 80<br>200 | 200 (RF) | | 290 | −32 |
| p-Type semiconductor layer | SiH$_4$<br>BF$_3$/H$_2$ (BF$_3$:1%)<br>H$_2$ | 8<br>300<br>6000 | 1500 (RF) | 1.0 | 260 | +135 |

Transparent electrode: ITO (In$_2$O$_3$ + SnO$_2$) thin film, 100 nm
Collector electrode: Aluminum (Al) thin film, 2 μm The production apparatus for the triple type solar cell was designed on the basis of the apparatus shown in FIG. 5 with addition of layer formation chambers for formation of the respective layers. Specifically, between layer formation chamber 508 for the p-type semiconductor layer and wind-up chamber 503, were provided additionally the layer formation chambers for an n-type semiconductor layer, an n/i buffering semiconductor layer, an i-type semiconductor layer, a p/i buffering semiconductor layer, a p-type semiconductor layer, an n-type semiconductor layer, an i-type semiconductor layer, and a p-type semiconductor layer, connected by gas gates 518 in series.

The produced triple type of solar cell was worked by a continuous modulation apparatus into unit modules in a size of 36 cm×22 cm.
(Evaluation)

The unit modules of the triple type solar cell were exposed to simulated sunlight of AM1.5 with energy density of 100 W/cm$^2$ to measure the photoelectric conversion efficiency η. As the result, the photoelectric conversion efficiency η was not lower than 11.5%, and the variation of the characteristics among the modules was within 3%.

Two of the worked unit modules were taken out and subjected to a continuous repeated bending test of 200 times. As the results, the characteristics did not deteriorated by the repeated bending, and the exfoliation or other defects of the deposition film was not observed. The modules were further exposed to simulated sunlight of AM1.5 with energy density of 100 W/cm$^2$ for 500 hours. Even after this exposure, the deterioration ratio of the photoelectric conversion efficiency η was not more than 8.5% relative to the initial value.

A power supply system of 5 kW could be constructed by connecting a number of the unit modules of this triple type solar cell.

EXAMPLE 5

A solar cell modules were produced under the same conditions as in Example 4 except that a-SiGe:H was used as the material for the first p/i buffering semiconductor layer in place of a-Si:H.
(Evaluation)

The worked modules were evaluated in the same manner as in Example 4. The photoelectric conversion efficiency was not lower than 12.2%. The variation of the characteristics among the solar cell modules was within the range of 5%. The repeated bending test of 200 times did not cause deterioration of the characteristics, and exfoliation of the deposition films. After continuous exposure to the simulated sunlight for 500 hours, the deterioration of the photoelectric conversion efficiency was within 7.1% relative to the initial value. A power supply system of 5 kW could be constructed by use of the solar cell modules.

EXAMPLE 6

A solar cell modules were produced under the same conditions as in Example 4 except that a-SiC:H was used as the material for the first p/i buffering semiconductor layer in place of a-Si:H. (Evaluation)
The worked modules were evaluated in the same manner as in Example 4. The photoelectric conversion efficiency was not lower than 7.4%. The variation of the characteristics among the solar cell modules was within the range of 5%. The repeated bending test of 200 times did not cause deterioration of the characteristics, and exfoliation of the deposition films. After continuous exposure to the simulated sunlight for 500 hours, the deterioration of the photoelectric conversion efficiency was within 6.7% relative to the initial value. A power supply system of 5 kW could be constructed by use of the solar cell modules.

As described above, in the process for producing a photovoltaic element of the present invention, in electric discharge generation for formation of buffering semiconductor layers, the potential polarity of the cathode electrode is reversed between an n-th buffering semiconductor layer and an (n+1)-th buffering semiconductor layer, or the potential polarity of one of the buffering semiconductor layers is made zero volt. Thereby, the buffering semiconductor layers formed at a pi interface or an ni interface can be adapted for the band gap of a p-layer or an n-layer and to prevent effectively thermal diffusion of a dopant in the p-layer or n-layer into an i-layer in film formation. The resulting solar cell has improved output characteristics, especially of the open-circuit voltage, and the fill factor.

The effective buffering semiconductor layer provided at the pi interface and/or ni interface prevents diffusion of a dopant, reducing the deterioration of a solar cell. Thereby, reliability of the solar cell is improved.

In particular, a lamination photovoltaic element can be formed with excellent pn junction, and can be produced uniformly with high reproducibility.

What is claimed is:

1. A process for producing a photovoltaic element having at least one pin junction above a substrate, and a buffering semiconductor layer constituted of plural sublayers between at least an n-type layer and an i-type layer or between an i-type layer and a p-type layer through production steps of introducing a source material gas into an electric discharge space in a reaction chamber, and decomposing the source material gas by plasma discharge to form a non-monocrystalline semiconductor layer, wherein, in electric discharge generation for formation of at least one of the buffering semiconductor layer, the polarity of the electrode confronting the substrate for formation of a first sublayer and the polarity of the electrode confronting the substrate for formation of a second sublayer adjacent to the first sublayer is made different from each other, or the potential of one of the electrodes is set at zero volt.

2. The process for producing a photovoltaic element according to claim 1, wherein at least a portion of the buffering semiconductor layer is formed from a-Si:H.

3. The process for producing a photovoltaic element according to claim 1, wherein at least a portion of the buffering semiconductor layer is formed from a-SiGe:H.

4. The process for producing a photovoltaic element according to claim 1, wherein at least a portion of the buffering semiconductor layer is formed from a-SiC:H.

5. The process for producing a photovoltaic element according to claim 1, wherein the photovoltaic element is a solar cell.

6. The process for producing a photovoltaic element according to claim 1, wherein the substrate is passed through plural spaces having respectively an electric discharging means in the process of formation of non-monocrystalline semiconductor layer.

7. The process for producing a photovoltaic element according to claim 1, wherein the substrate is in a shape of a belt.

* * * * *

UNITED STATES PATENT AND TRADEMARK OFFICE
CERTIFICATE OF CORRECTION

PATENT NO. : 6,261,862 B1
DATED : July 17, 2001
INVENTOR(S) : Tadashi Hori et al.

It is certified that error appears in the above-identified patent and that said Letters Patent is hereby corrected as shown below:

Column 1,
Line 23, "is" should read -- are --;
Line 35, "region," should read -- regions, --; and
Line 66, "varieties" should read -- variety --.

Column 2,
Line 13, "are" should be deleted; and
Line 51, "is" should read -- are --.

Column 4,
Line 5, "uniformized." should read -- made uniform. --;
Line 7, "a" should be deleted; and
Line 12, "is" should read -- are --.

Column 6,
Line 11, "a" (both occurrences) should read -- an -.

Column 7,
Line 21, "is" should read -- are --; and
Line 41, "lamp." should read -- lamps. --.

Column 8,
Line 23, "vessel" should read -- vessels --;
Lines 51, 54, 57 and 62, "space" should read -- spaces.

Column 9,
Line 11, "opening" should read -- openings --; and
Line 53, "in the" should be deleted.

Column 12,
Line 60, "layer" (second occurrence) should read -- layers --.

Column 14,
Line 11, "is" should read -- are --; and
Line 13, "years" should read -- year --.

Column 17,
Line 40, "was" should read -- were --.

UNITED STATES PATENT AND TRADEMARK OFFICE
CERTIFICATE OF CORRECTION

PATENT NO. : 6,261,862 B1
DATED : July 17, 2001
INVENTOR(S) : Tadashi Hori et al.

It is certified that error appears in the above-identified patent and that said Letters Patent is hereby corrected as shown below:

Column 19,
Line 58, "deteriorated" should read -- deteriorate --; and
Line 60, "was" should read -- were --.

Column 20,
Line 35, "A solar" should read -- Solar --; and
Line 53, "A solar" should read -- Solar --.

Column 22,
Line 3, "layer," should read -- layers, --; and
Line 7, "is" should read -- are --.

Signed and Sealed this

Fifth Day of March, 2002

*Attest:*

*Attesting Officer*

JAMES E. ROGAN
*Director of the United States Patent and Trademark Office*